(12) United States Patent
Yang

(10) Patent No.: US 7,575,852 B2
(45) Date of Patent: *Aug. 18, 2009

(54) METHOD OF OPTICALLY TRANSFERRING A PATTERN FROM A MASK HAVING ADVANCED ORIENTED ASSIST FEATURES FOR INTEGRATED CIRCUIT HOLE PATTERNS

(75) Inventor: Chin Chen Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 736 days.

This patent is subject to a terminal disclaimer.

(21) Appl. No.: 10/923,462

(22) Filed: Aug. 20, 2004

(65) Prior Publication Data

US 2006/0040189 A1    Feb. 23, 2006

(51) Int. Cl.
G03F 7/20 (2006.01)
G03F 1/14 (2006.01)

(52) U.S. Cl. .................................... 430/311; 430/5

(58) Field of Classification Search ............. 430/311
See application file for complete search history.

(56) References Cited

U.S. PATENT DOCUMENTS

| 5,725,969 | A * | 3/1998 | Lee ............................ 430/311 |
| 6,905,899 | B2 * | 6/2005 | Yang ........................... 430/30 |
| 2002/0045106 | A1 * | 4/2002 | Baselmans et al. ......... 430/311 |
| 2004/0009409 | A1 * | 1/2004 | Hwang et al. ................ 430/5 |
| 2004/0038135 | A1 * | 2/2004 | Griesinger et al. ......... 430/311 |
| 2004/0111693 | A1 * | 6/2004 | Lin et al. ..................... 716/19 |
| 2005/0076321 | A1 * | 4/2005 | Smith .......................... 430/311 |

* cited by examiner

*Primary Examiner*—Mark F Huff
*Assistant Examiner*—John Ruggles
(74) *Attorney, Agent, or Firm*—Stout, Uxa, Buyan & Mullins, LLP

(57) ABSTRACT

An oriented assist feature is described that permits transferring of a lithographic pattern corresponding to an integrated circuit from a mask onto a semiconductor substrate. The oriented assist feature does not exhibit a forbidden pitch phenomenon, thereby providing a wide photo process window for a hole pattern.

4 Claims, 8 Drawing Sheets

METHOD OF OPTICALLY TRANSFERRING A PATTERN FROM A MASK HAVING ADVANCED ORIENTED ASSIST FEATURES FOR INTEGRATED CIRCUIT HOLE PATTERNS

BACKGROUND OF THE INVENTION

1. Field of the Invention

The present invention relates generally to semiconductor fabrication methods and, more particularly, to methods of transferring photolithographic patterns to a semiconductor substrate.

2. Description of Related Art

The density of memory chips continues to push technological limits as ever-greater numbers of memory cells are provided on a single chip. Memory chips are characterized by relatively large areas of nearly-identical devices, i.e., memory cells, the density of which often approaches limits dictated by photolithographic considerations. Methods have been and continue to be developed in the prior art by which large arrays of memory cells can be fabricated with relatively high density.

Memory chips frequently include, in addition to memory cells, electronic components such as select transistors, address decoders, drivers, and so on that do not exhibit the regularity of arrays of memory cells. These additional electronic components typically are placed in a peripheral area of the memory chip, separate from the memory array itself. As such, the additional electronic components tend to be more widely separated geometrically than do the components of memory cells. For this reason, seemingly identical structures as simple as connection paths, contact points, or holes, can, when fabricated by a process that includes photolithographic steps, appear different depending upon whether the structure appears in the array or in the peripheral area of a chip. For example, two parallel lines that represent conduction paths, when they appear very close together, may have their shape modified by an optical interference pattern that forms between the lines. By "close together" in this context it is meant that the distance between lines is on the order of the wavelength of the light used by the photolithographic process. Objects that appear in such close proximity can create optical interference effects not generated by more widely spaced objects. For this reason, identical features on a mask may not result in identical features on a chip after the features are transferred to the surface of a wafer.

FIG. 1A illustrates an example of a mask pattern that exhibits the effects just described. The pattern shown in FIG. 1A comprises a collection of relatively densely packed array features 100, having a square shape of length (S) on a side, located in an array region, and spaced according to an array pitch ($P_A$) having a value on the order of the wavelength of the light used in the photolithographic process. Representative values of S are on the order of 0.16 µm; and typical values for $P_A$ may be about 0.3 µm. Often, S represents a critical dimension (CD), i.e., a dimension of a smallest possible feature that can be fabricated with a given manufacturing process. The CD represented by the features in FIG. 1A is the CD associated with the mask that defines features and may be referred to as a mask CD (MCD). Other forms of CD may correspond to a CD after a layer of photoresist exposed according to the mask pattern has been developed. Such a CD may be referred to as a development CD (DCD). After an etch step, the CD may be described as an etch CD (ECD).

The mask pattern illustrated in FIG. 1A further comprises a collection of peripheral features 200, which are not densely packed, the peripheral features 200 having a shape similar to the shape of the array features 100. The peripheral features 200 are located in a peripheral region and spaced according to a pitch ($P_1$), where $P_1$ is larger than $P_A$. According to a representative numerical example, the value of the pitch $P_1$ illustrated in FIG. 1A is about 1.5 µm. When the mask pattern illustrated in FIG. 1A is transferred to a wafer, optical interference effects can influence the size and shape of the closely spaced array features 100. However, the peripheral features 200 are not so affected because of their relatively wide spacing. Therefore, array features 100 and peripheral features 200 that appear to be identical (except for their spacing) on a mask will not always be identical when transferred to a wafer.

Typically, the effects of optical interference are factored into the design of a mask by adjusting the form of the array features 100 using methods known in the art. One view of this process is that the array features are "pre-distorted" so that the array features will appear as desired when they are transferred to a wafer. Optical interference effects, generally, have no effect on the peripheral features 200. Therefore, applying the same pre-distortion to the peripheral features 200 as is applied to the array features 100 results in the transfer of the peripheral features 200 to the wafer in a distorted form.

Methods are known that can compensate for the above-described effect of pre-distortion on peripheral elements. According to one example, a mask corresponding to a feature (e.g., a line, a hole, or a square as illustrated in FIG. 1A) in the peripheral area of a chip may have an added "assist feature" formed near the peripheral feature, the assist feature being designed to undo the effects of distortion on peripheral elements. Typically, the assist feature has a width narrow enough that the assist feature will not be transferred to the wafer by the photolithographic process (i.e., the assist feature will not "print out"). However, the assist feature can alter the phase of light waves near the peripheral feature, thereby causing the shape of the peripheral feature after transfer to a wafer to conform to the shape of an array feature.

FIG. 1B illustrates such a prior-art assist feature 205 added to the mask illustrated in FIG. 1A. The prior-art assist feature 205 has a fixed length S equal to the side dimension of the peripheral feature 200. The prior-art assist feature 205 further has a fixed width ($w_p$) and is placed parallel to and separated from the peripheral feature 200 by a fixed distance ($d_p$). For suitably chosen values of $w_p$ and $d_p$, the pattern illustrated in FIG. 1B, when transferred to a wafer, prints out as the ideal mask illustrated in FIG. 1A as a consequence of adding the assist features 205.

Unfortunately, the method implicitly illustrated in FIG. 1B does not apply for all values of spacing between peripheral features 200. For example, as illustrated in FIG. 2, an application may place the same peripheral features 200 at a new spacing according to a pitch ($P_2$) where $P_2$ may range from about 0.6 µm to about 1 µm. In this range of spacing, the assist features 205 become closely enough spaced to create new optical interference effects. Accordingly, the peripheral features 200 may themselves become distorted when the mask pattern is transferred to a wafer. In practice, such distortion can occur for a certain range of pitch values that may be referred to as "forbidden pitch" values. These forbidden pitch values complicate the design of masks having array regions and peripheral regions. In particular, the allowable error in aligning masks of different layers of an integrated circuit can become unacceptably small, which condition can be described as a very small common window of usable photolithographic process parameters.

A need thus exists in the prior art for assist features that do not exhibit the forbidden pitch phenomenon. A further need exists for a method of placing assist features that leads to a relatively large common window of usable parameters of a photolithographic process.

SUMMARY OF THE INVENTION

The present invention addresses these needs by providing a method of optically transferring a lithographic pattern from a mask onto a semiconductor substrate. The lithographic pattern may correspond to an integrated circuit, and the transferring may be accomplished by using an optical exposure tool. The method of the invention herein disclosed comprises forming a plurality of main features on the mask, the features corresponding to elements on the integrated circuit. A plurality of oriented assist features may be formed on the mask near the plurality of main features. In an implementation of the method of the invention, the forming of the plurality of oriented assist features may have dimensions of length and width, wherein the length is greater than the width. The length dimension normally is oriented in a direction nominally outward and perpendicular to edges of the plurality of main features.

Another implementation of the present invention comprises a method of forming a mask for optically transferring a lithographic pattern having a plurality of isolated elements onto a semiconductor substrate wherein the plurality of isolated elements may include a design critical dimension (DCD) target, and spacing between isolated elements may be controlled according to a given pitch. Minimum design rules may be received, and an illumination mode and a mask critical dimension (MCD) for the plurality of isolated elements may be selected according to the minimum design rules. A focus and energy matrix (FEM) then may be generated in accordance with the illumination mode and the MCD. The FEM may be used to determine depth of focus, optimum exposure energy, and focus center. MCD sizes of the plurality of isolated elements then may be adjusted to meet the DCD target according to the minimum design rules. A plurality of assist features then may be disposed around the plurality of isolated elements. Each assist feature normally has a width, a length, a first separation parameter, and a second separation parameter. The first separation parameter defines a distance between individual assist features; the second separation parameter defines a distance between the plurality of assist features and the plurality of isolated elements. Optimized values of the width, length, and first and second separation parameters are then determined, and an assist feature rule is set according to the given pitch and the optimized values.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1A:
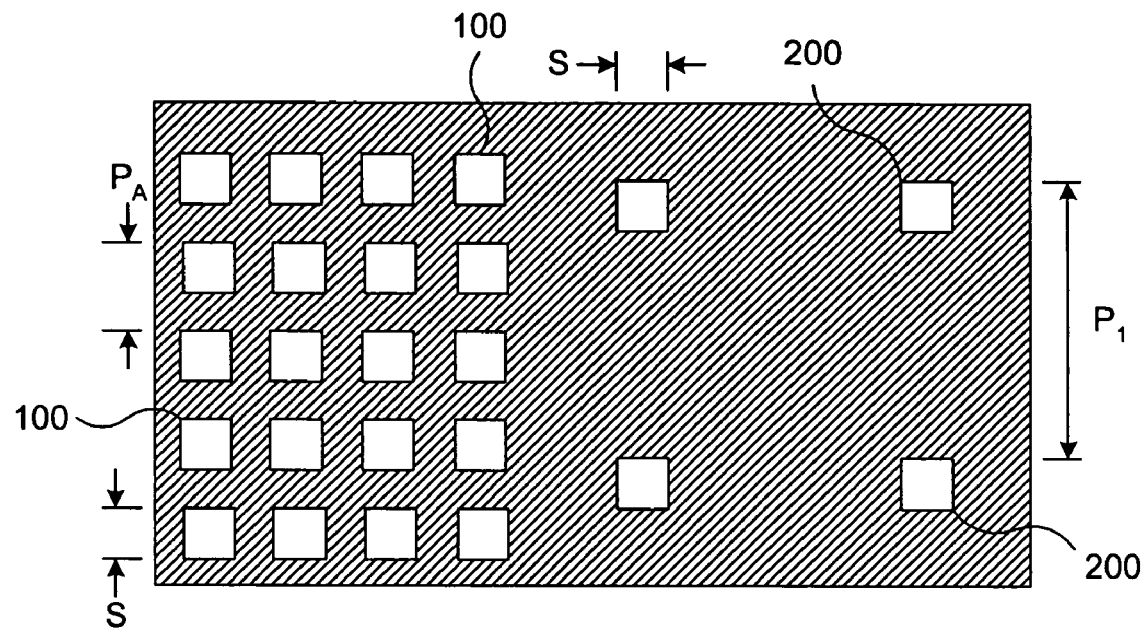
FIG. 1A is a plan view of a prior-art integrated circuit mask having an array area and a peripheral area.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of integrated circuits. The present invention may be practiced in conjunction with various integrated circuit fabrication techniques that are conventionally used in the art, and only so much of the commonly practiced process steps are included herein as are necessary to provide an understanding of the present invention.

Figure 3:
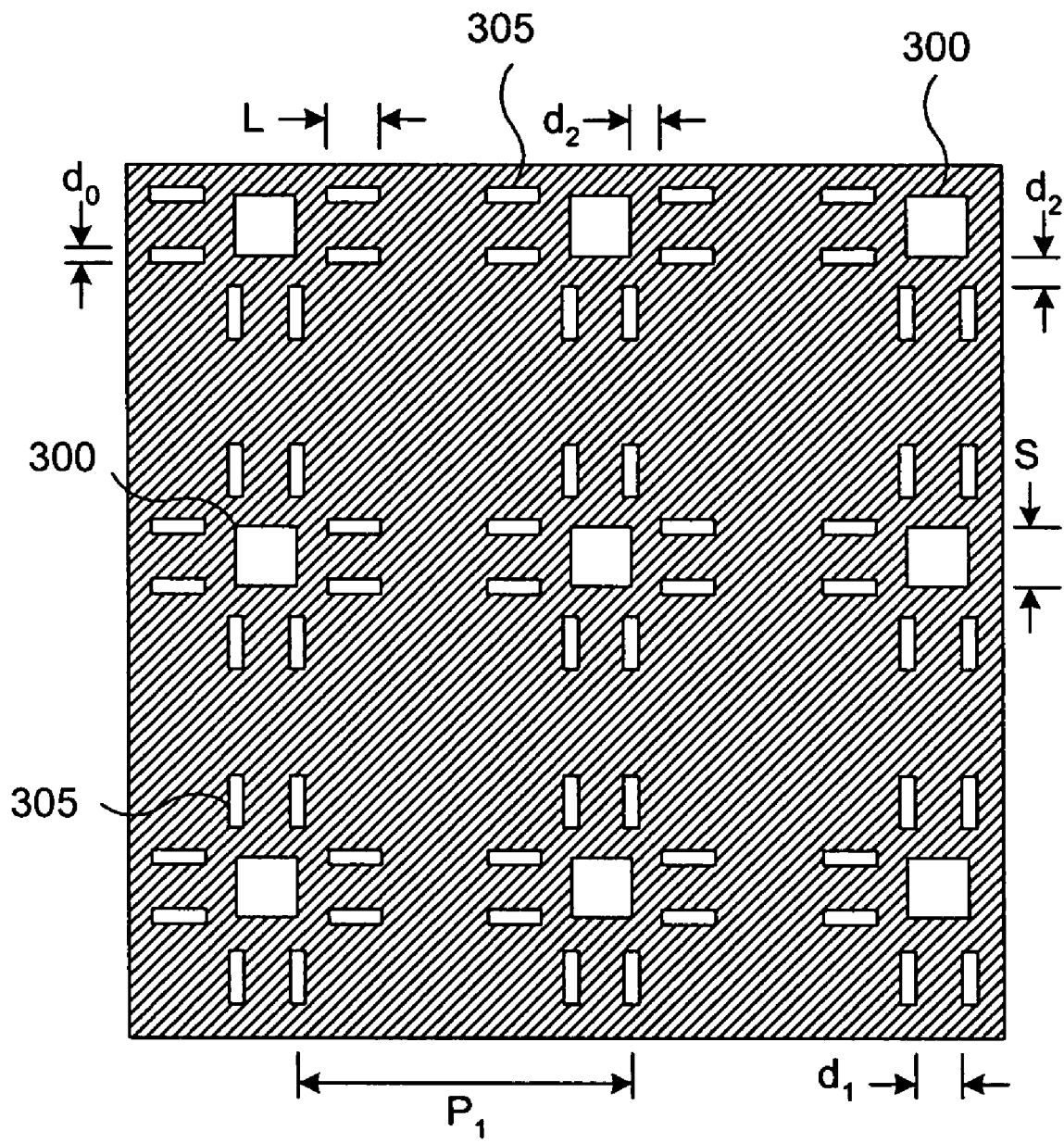
FIG. 3 is a plan view of a peripheral region of an integrated circuit mask having an oriented assist feature applied in accordance with the present invention.

FIG. 3 is a plan view of a peripheral region of an embodiment of an integrated circuit mask having main features 300 and oriented assist features 305 placed in accordance with an aspect of the present invention. Before the oriented assist features 305 are added, the integrated circuit mask may have the same form, i.e., it may include an array region and a peripheral region, as the prior art mask shown in FIG. 1A. The oriented assist features 305 are oriented in a direction generally outward from and perpendicular to main features 300. According to the illustrated embodiment, eight oriented assist features 305 are disposed around each main feature 300.

The oriented assist features 305 have length (L) and width ($d_0$), are spaced a distance ($d_1$) from each other, and are spaced a distance ($d_2$) from the main features 300. The distances $d_1$ and $d_2$ may be referred to as respective first and second separation parameters. In practice, typical values of $d_0$ may be less than about ⅖ λ where λ is a wavelength associated with a light source used in a photolithographic process. Typical values of $d_1$ and $d_2$ can be greater than about ⅗ λ. Oriented assist features 305 located at a distance of $d_2$ from main features 300 can be said to be "near" the main features 300. For example, if light having a wavelength λ=250 nm is used, then typical values for $d_0$ may be less than about 100 nm with $d_1$ and $d_2$ typically being greater than about 150 nm. In the illustrated embodiment, the main features 300 are spaced from each other according to the same pitch ($P_1$) shown in FIGS. 1A and 1B. The main features 300 have the shape of squares having a side of length S. Other embodiments of the integrated circuit mask may employ main features having other shapes. For example, circular main features having a diameter of S may be used in some embodiments.

Figure 1B:
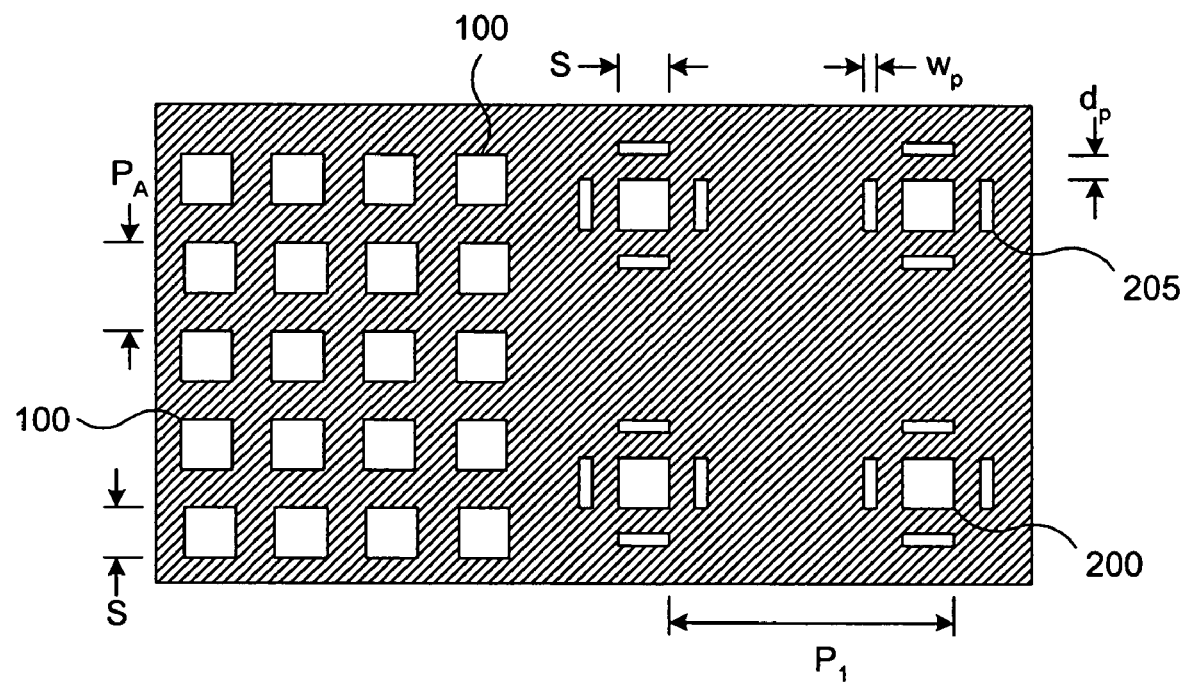
FIG. 1B is a plan view of the prior-art integrated circuit mask of FIG. 1A with an added prior-art assist feature.
Figure 2:
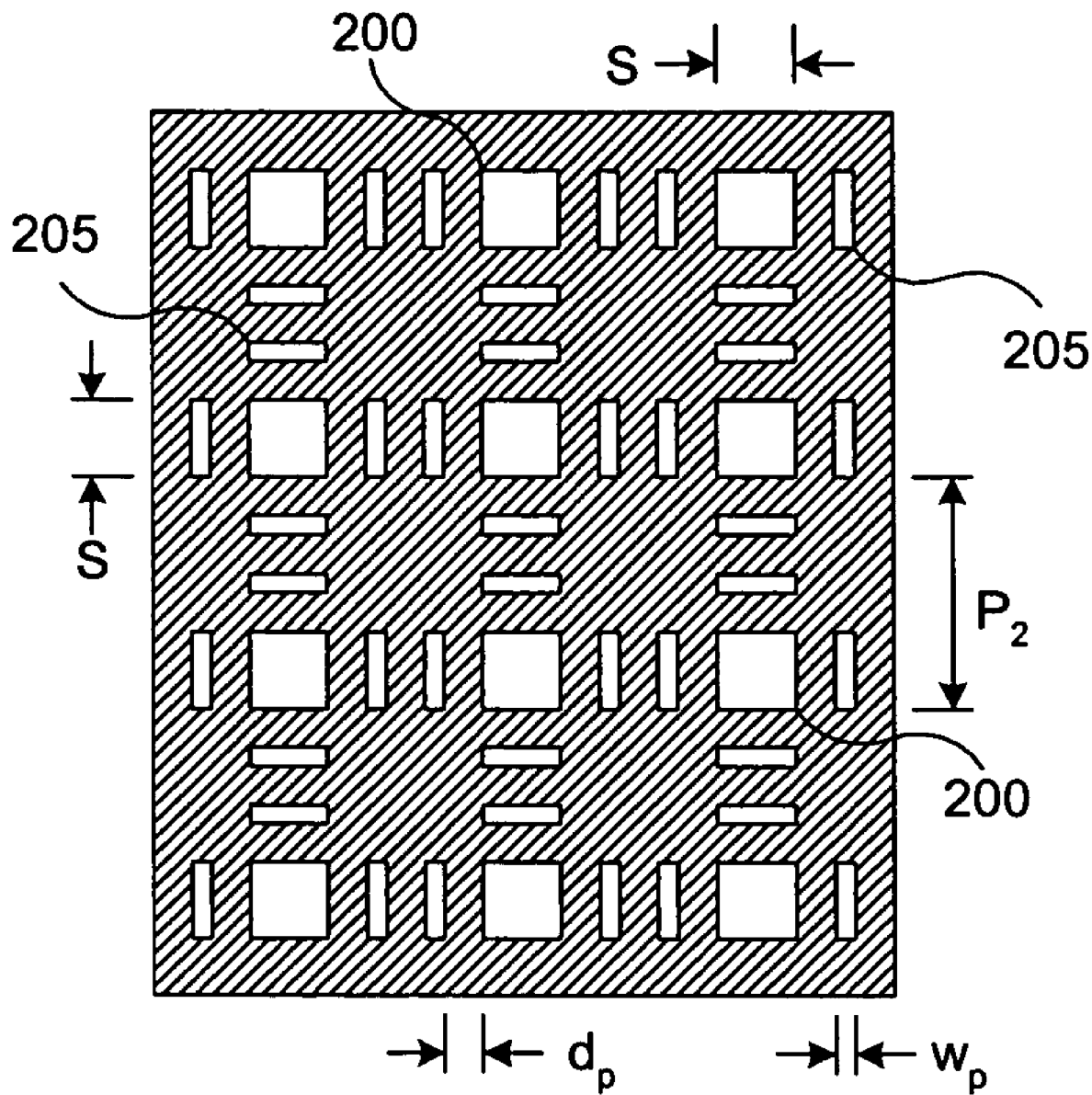
FIG. 2 is a plan view of a peripheral region of a prior-art integrated circuit mask that can exhibit a forbidden pitch effect.

The oriented assist features 305 illustrated in FIG. 3 may perform a similar function as the prior-art assist features 205 illustrated in FIGS. 1B and 2 in the sense that they seek to prevent distortion of the main features 300 relative to that of array features (cf. array features 100, FIG. 1B) when the main features 300 are transferred to a wafer. However, unexpectedly, and according to an aspect of the present invention, the perpendicular alignment of the oriented assist features 305 does not exhibit a forbidden pitch phenomenon.

Figure 4:
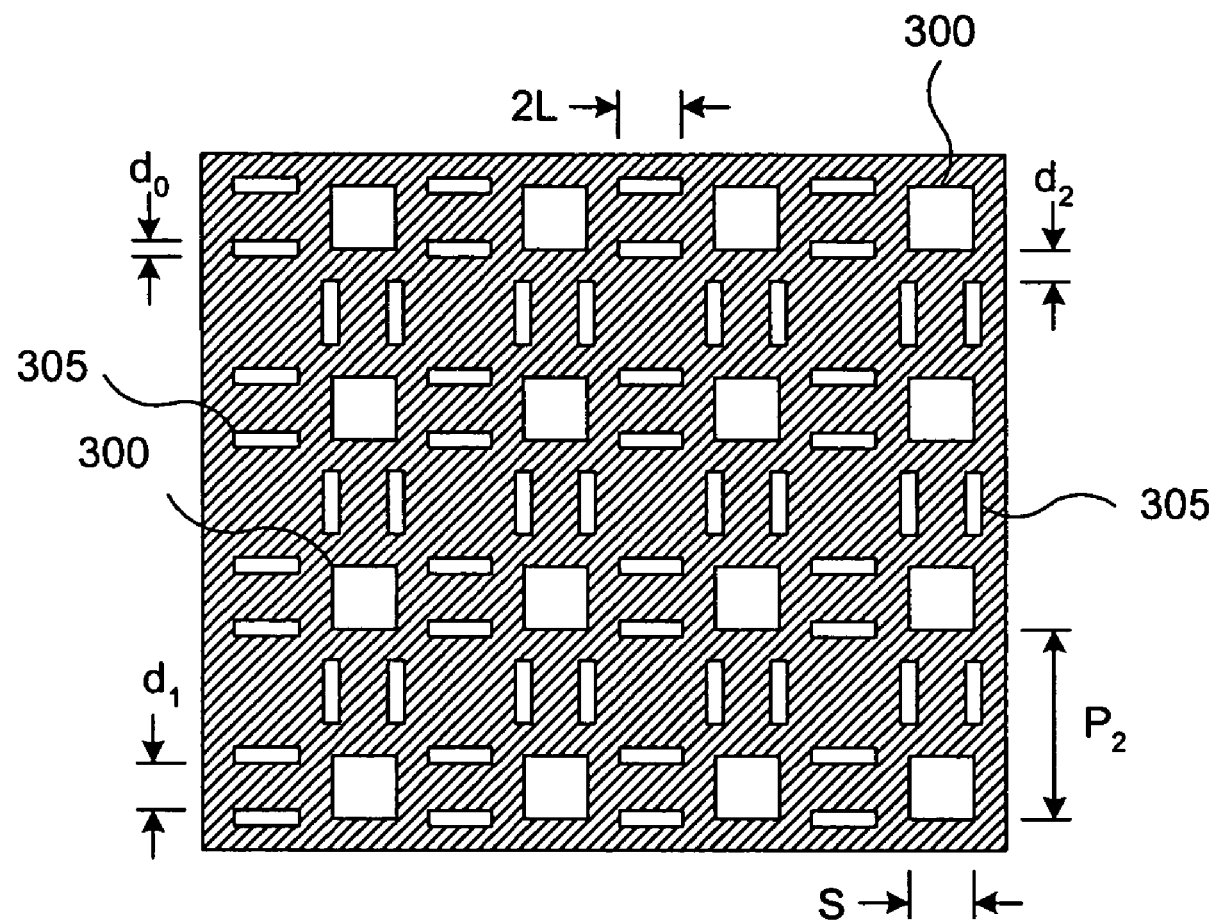
FIG. 4 is a plan view of a peripheral region of a modified integrated circuit mask which employs the oriented assist feature of the present invention and which does not exhibit the forbidden pitch effect.
Figure 5:
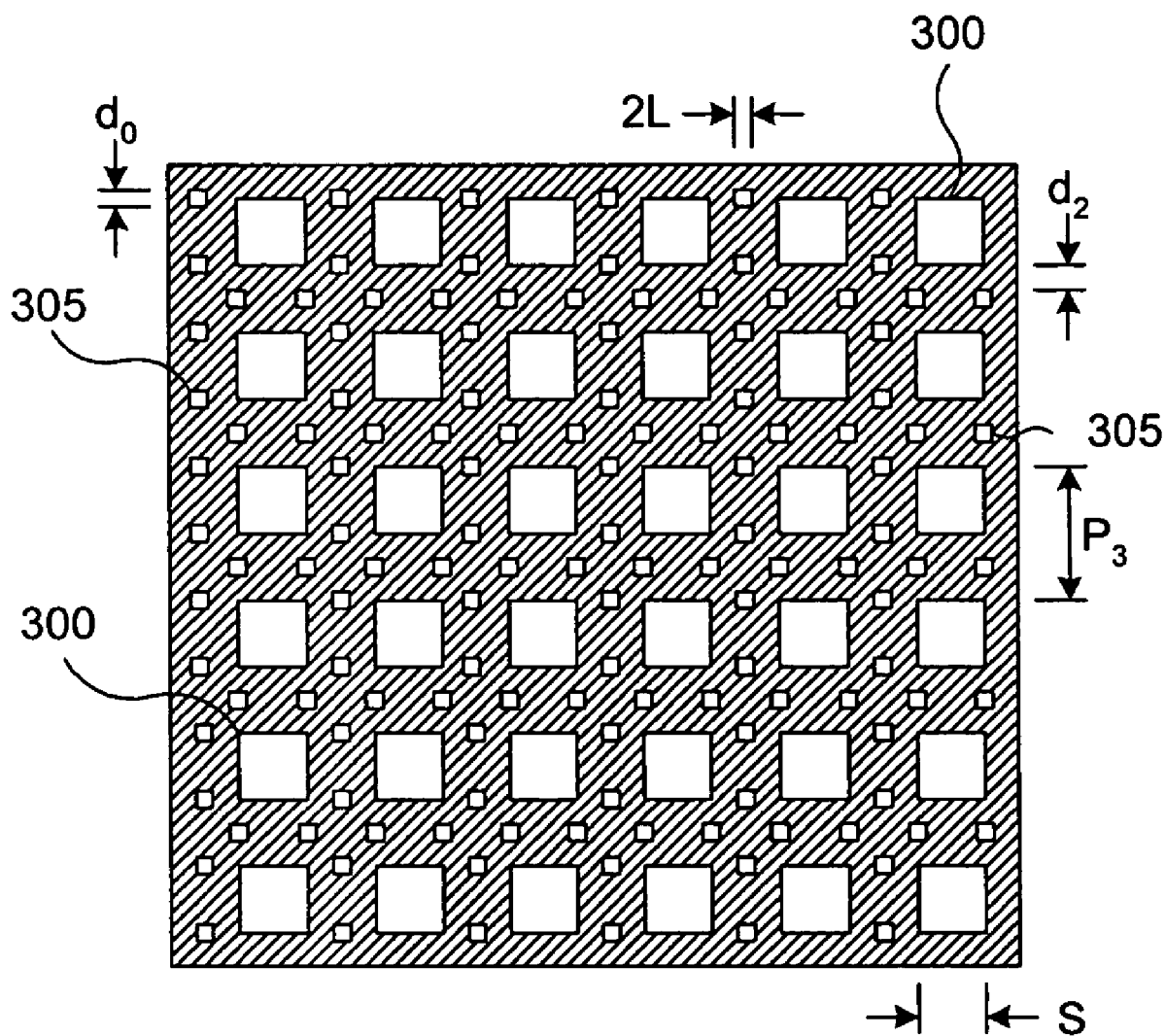
FIG. 5 is a view similar to that of FIG. 4 of another modified integrated circuit mask having main features spaced closer together wherein the oriented assist feature of the present invention is employed to avoid the forbidden pitch effect.

According to a representative numerical example, the value of the pitch $P_1$ illustrated in FIG. 3 may occupy a range from about 1 μm to about 1.5 μm. FIG. 4 illustrates a similar peripheral region of a mask having main features 300 spaced according to a pitch ($P_2$) that may lie in a range of about 0.8 μm to about 1 μm. It will be noted in FIG. 4 that the oriented assist features 305 associated with a main feature 300 actually merge with oriented assist features 305 associated with an adjacent main feature 300. However, the forbidden pitch phenomenon is not observed, even with this range of spacing. Neither does the forbidden pitch problem occur in the representative example illustrated in FIG. 5 wherein the main features 300 are spaced according to an even smaller value of pitch ($P_3$) that may range from about 0.6 μm to about 0.8 μm.

Figure 6:
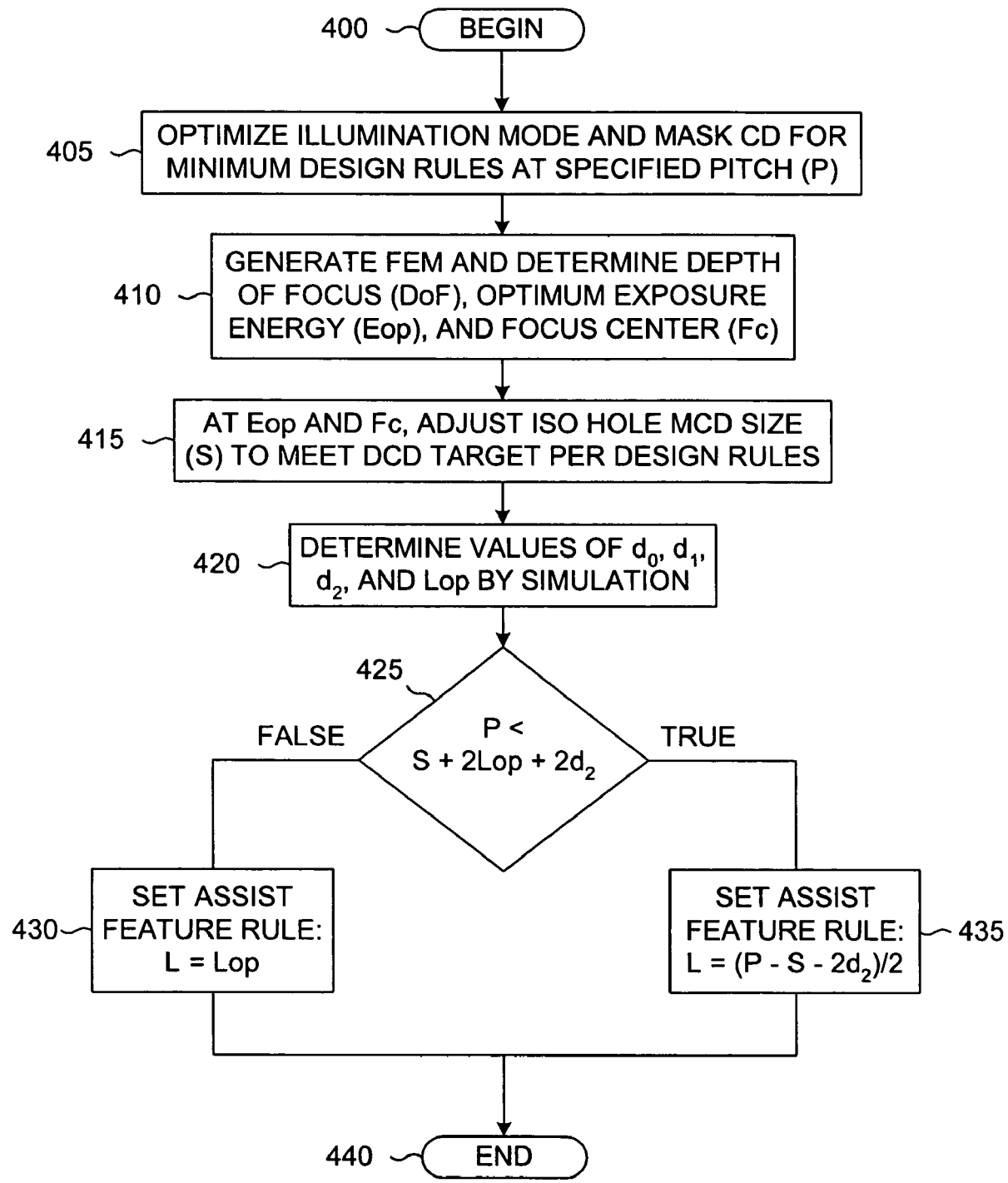
FIG. 6 is a flow diagram illustrating an implementation of a method of placing oriented assist features according to the present invention.

FIG. 6 is a flow diagram that illustrates an embodiment of a method for placing oriented assist features according to the present invention. The method operates according to minimum design rules established for the photolithographic process used to create an integrated circuit, the minimum design rules existing outside the present invention. In this sense, the minimum design rules are "received" by the method, which begins at step 400. An illumination mode and mask critical dimension (MCD) are then optimized according to the minimum design rules for a specified pitch (P) at step 405. Available illumination modes include disk illumination mode, off-axis illumination, quasar illumination, and dipole illumination. Parameters of the illumination mode may include a value for a numerical aperture (NA) and a radius (σ).

Figure 7:
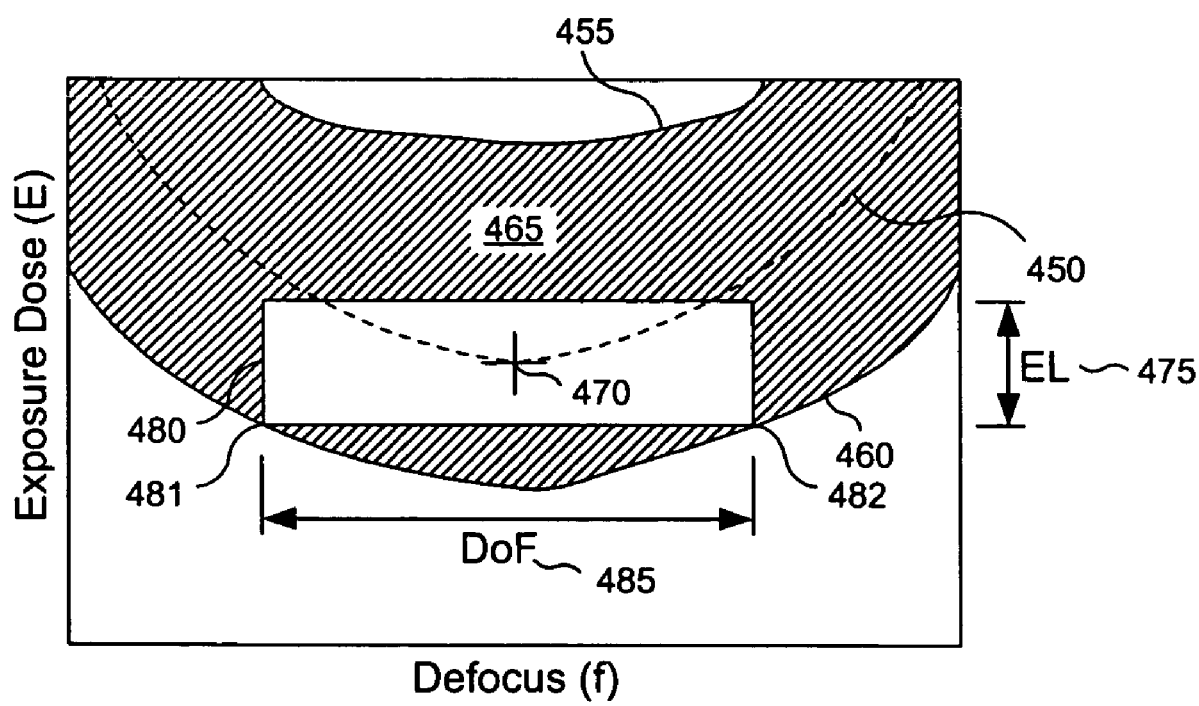
FIG. 7 is a pictorial diagram representing a focus and energy matrix.

At step 410, a focus and energy matrix (FEM) is generated. A representation of an FEM is portrayed in FIG. 7, illustrating a collection of points defined by paired values of defocus distance (f) and exposure energy (E) in an f-E plane. Generally, a design critical dimension (DCD) depends upon chosen values for f and E. An FEM quantifies this dependence by displaying points in the f-E plane that yield a DCD target to within a specified range. For example, a DCD target value may be 0.2 μm, and the specified range may be ±0.02 μm. A collection of (f, E) values that produce the 0.2 μm DCD target value may correspond to the dotted line 450 shown in FIG. 7. Similarly, (f, E) values that produce the 0.2 μm DCD target value plus an extent of the specified range (i.e. 0.2+0.02=0.22 μm) may correspond to an upper solid line 455 in FIG. 7. Conversely, a lower solid line 460 in FIG. 7 may represent (f, E) values that produce the 0.2 μm DCD target value minus an extent of the specified range (i.e. 0.2−0.02=0.18 μm). Points between the upper solid line 455 and the lower solid line 460, denoted by the cross-hatched area 465 in FIG. 7, represent (f, E) values that produce DCD values within the specified range of the DCD target value.

The dotted line 450, representing the DCD target value, may have a minimum point 470 corresponding to a value of defocus distance (f) for which exposure energy (E) is a minimum. The values of f and E at the minimum point 470 may be denoted as E=Eop, optimum exposure energy, and f=Fc, focus center. Around the minimum point 470, a range of exposure energy may be defined, referred to as exposure latitude (EL) typically given as a percentage of Eop. FIG. 7 illustrates a chosen value of EL 475 centered above and below the minimum point 470. With EL defined, a rectangle 480 can be generated extending EL/2 above and EL/2 below the minimum point, extending left in an f-direction to a left intersection 481 with the lower solid line 460 and extending right in the f-direction to a right intersection 482 with the lower solid line 460. The rectangle 480, so generated, has a width representing a depth of focus denoted in FIG. 7 by DoF 485.

Returning to FIG. 6, once the Eop and Fc are determined, an MCD size (S) of a pattern of a main feature on a mask can be chosen at step 415 in order that the DCD target is met. Normally, a DCD target can be met by choosing a sufficiently large value for S. Usually a DCD of an isolated hole (i.e., an iso hole) in the peripheral region will be smaller than a DCD for a hole in the array region (i.e., a dense hole). Therefore, the MCD at the Eop and Fc may need to be adjusted to keep the same DCD for a dense hole and an iso hole at step 415.

For the values of Eop, Fc, and S obtained in earlier steps, parameters of oriented assist features are determined by simulation at step 420. These parameters include $d_0$, $d_1$, $d_2$, (see, e.g., FIG. 3) and an optimum value for L (Lop). It will be recalled that the variable L designates the length of the oriented assist features (see, e.g., FIG. 3). Thus, the variable L designates an optimum value for the length of the oriented assist features.

A test then is performed at step 425 to determine whether the oriented assist features associated with adjacent main features, if implemented according to the determined values of $d_0$, $d_1$, $d_2$, and Lop, overlap. If the oriented assist features of adjacent main features do not overlap, then the length of the oriented assist features is set to L=Lop at step 430. If the oriented assist features of adjacent main features do overlap, then the length of the oriented assist features is set at step 435 to half of the available distance between main features given P, S, and $d_2$, namely, L=(P−S−2$d_2$)/2. It should be noted that this choice of L accounts for merged oriented assist features.

The method ends at 440 having determined all of the parameters of the oriented assist features according to the present invention.

Figure 8:
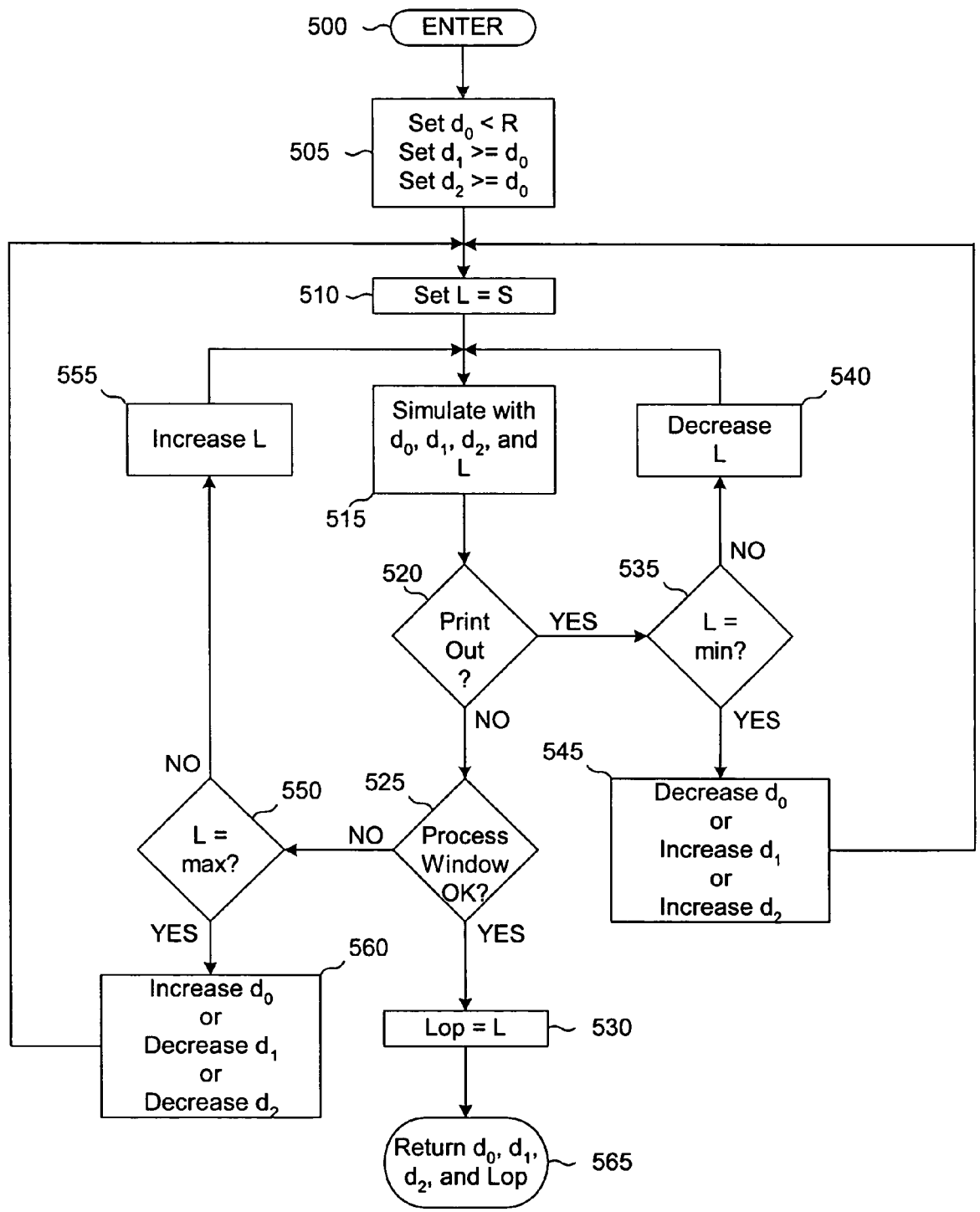
FIG. 8 is a flow diagram outlining details of a simulation step of the implementation of the method of FIG. 6.

Details of a process for selecting values of $d_0$, $d_1$, $d_2$, and Lop at step 420 comprise a procedure summarized by a flow diagram shown in FIG. 8. The procedure is entered at step 500, and initial values for $d_0$, $d_1$, and $d_2$ are selected at step 505. Specifically, an initial value is selected for $d_0$ that is less than a resolution parameter (R). Typically, R is on the order of $\lambda$, the wavelength of light used in the photolithographic process. Initial values for $d_1$ and $d_2$ are selected to be at least as large as $d_0$. The method of the present invention does not control a value for the resolution parameter. Therefore, the resolution parameter (R) may be viewed as being "received." A value of S (see, e.g., FIG. 3) is selected for a trial value of L at step 510, and a simulation is performed at step 515 to determine the characteristics of the mask pattern after transfer to a wafer. Typically, a computer performs the simulation according to a computer program; several such computer programs are available commercially. A test is then performed at step 520 to determine whether the oriented assist feature will "print out," i.e. transfer to a semiconductor substrate, when the current values of $d_0$, $d_1$, $d_2$, and the trial value of L are used. If it is determined that the oriented assist feature will print out, then the trial value of L is reduced, if possible. Reducing the trial value of L comprises checking at step 535 to determine whether the trial value of L already is at a minimum value, $L_{min}$. If the trial value of L does not equal $L_{min}$, then the trial value of L is decreased at step 540, and the process is repeated beginning at step 515. If the trial value of L equals $L_{min}$, then either $d_0$ is decreased, $d_1$ is increased, or $d_2$ is increased at step 545, and the process repeats starting at step 510. In typical examples, it makes no difference whether $d_0$ is decreased, $d_1$ is increased, or $d_2$ is increased at step 545 because the three effects influence each other. In any case, a combination of values for $d_0$, $d_1$, and $d_2$ should be chosen such that a maximum DoF is obtained without printing out the oriented assist feature. If at step 520 it is determined that the oriented assist feature does not print out, then a test is performed at step 525 to determine whether the process window is acceptable with the current values of $d_0$, $d_1$, $d_2$, and the trial value of L. Process window acceptability depends upon details of a specific product and technology. For example, a DoF greater than 0.45 µm with an EL of 8% may be acceptable for 130 nm technology, while a DoF greater than 0.25 µm with an EL of 5% may be acceptable for 65 nm technology. An acceptable value for DoF may depend upon an exposure tool. A more advanced tool can more accurately control exposure and focus, so a smaller value of DoF can be tolerated when compared with a DoF required with a less advanced tool. Although the process window can be determined by simulation, an offset may exist between a process window computed by simulation and a process window observed on a real wafer process. The minimum acceptable process window may depend upon photo generation and scanner ability.

If the process window is acceptable, then Lop is set to the trial value of L at step 530, and the process is exited at step 565, returning values for $d_0$, $d_1$, $d_2$, and Lop. If the process window is not acceptable, then the trial value of L is increased, if possible. First the trial value of L is checked against a maximum value for the trial value of L, $L_{max}$, at step 550. If the trial value of L is not greater than $L_{max}$, then the trial value of L is increased at step 555, and the process is repeated beginning at step 515. If the trial value of L equals $L_{max}$, then either $d_0$ is increased, $d_1$ is decreased, or $d_2$ is decreased at step 560, and the process repeats starting at step 510. As before, it makes no difference whether $d_0$ is decreased, $d_1$ is increased, or $d_2$ is increased at step 555 because the three effects influence each other. Again, a combination of values for $d_0$, $d_1$, and $d_2$ should be chosen such that a maximum DoF is obtained without printing out the oriented assist feature. According to an exemplary embodiment, values for $L_{min}$ and $L_{max}$ are chosen such that a maximum of the DoF occurs for a value of L in a range defined by $L_{min}<L<L_{max}$.

In view of the foregoing, it will be understood by those skilled in the art that the methods of the present invention can facilitate formation of integrated circuits that do not exhibit the phenomenon of forbidden pitch. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of optically transferring a lithographic pattern corresponding to an integrated circuit from a mask onto a semiconductor substrate by use of an optical exposure tool having a wavelength, the method comprising:
    forming a plurality of main features on the mask, the features corresponding to elements on the integrated circuit; and
    forming a plurality of oriented assist features on the mask disposed near the plurality of main features, each of the plurality of assist features having a length dimension and a width dimension, wherein the length dimension is greater than the width dimension and is greater than about 0.6 times the wavelength, and the length dimension is perpendicular to a side of and adjacent to a corner of one main feature.

2. The method as set forth in claim 1, wherein the forming of the plurality of assist features comprises disposing the plurality of assist features at a distance greater than about 0.6 times the wavelength from the plurality of main features.

3. The method as set forth in claim 1, wherein the forming of the plurality of assist features comprises disposing each assist feature at a distance greater than about 0.6 times the wavelength from another assist feature.

4. The method as set forth in claim 1, wherein the forming of the plurality of oriented assist features comprises forming each of the assist features having a width dimension less than about 0.4 times the wavelength.

* * * * *

UNITED STATES PATENT AND TRADEMARK OFFICE
CERTIFICATE OF CORRECTION

PATENT NO.       : 7,575,852 B2                                                     Page 1 of 1
APPLICATION NO.  : 10/923462
DATED            : August 18, 2009
INVENTOR(S)      : Chin Chen Yang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Seventh Day of September, 2010

David J. Kappos
*Director of the United States Patent and Trademark Office*